United States Patent [19]

Bruns et al.

[11] Patent Number: 4,946,751

[45] Date of Patent: Aug. 7, 1990

[54] METHOD OF MANUFACTURING A MASK FOR RADIATION LITHOGRAPHY

[75] Inventors: Angelika Bruns, Henstedt-Ulzburg; Waldemar Götze; Margret Harms, both of Hamburg; Holger Lüthje, Halstenbek, all of Fed. Rep. of Germany

[73] Assignee: U.S. Philips Corporation, New York, N.Y.

[21] Appl. No.: 239,093

[22] Filed: Aug. 31, 1988

[30] Foreign Application Priority Data

Sep. 3, 1987 [DE] Fed. Rep. of Germany ....... 3729432

[51] Int. Cl.$^5$ ................................................ G03F 1/00
[52] U.S. Cl. .................................... 430/5; 204/192.15; 204/192.28; 378/35
[58] Field of Search .......... 430/5; 204/192.15, 192.22, 204/192.26, 192.28; 378/35

[56] References Cited

U.S. PATENT DOCUMENTS 4,218,503  8/1980  Reekstin et al. ..................... 428/195
4,719,161  1/1988  Kimura et al. ........................... 430/5

FOREIGN PATENT DOCUMENTS 182422  9/1985  Japan ...................................... 430/5

OTHER PUBLICATIONS

Munz et al., "Reactive High Rate Sputtering of Oxides", Thin Solid Films, 86 (1981) pp. 175–181.

*Primary Examiner*—Jose Dees
*Attorney, Agent, or Firm*—Paul R. Miller

[57] ABSTRACT

A method is set forth of manufacturing a mask for radiation lithography having a mask support and a substrate, on which an absorber layer is provided to be structured according to a desired mask pattern. The absorber layer having a thickness preferably in the range of from 0.2 to 1.2 $\mu$m of partly oxidized tungsten having an oxygen content in the range of from 21 to 29 at. % in the layer is deposited on the substrate, preferably by means of cathode sputtering.

47 Claims, 1 Drawing Sheet

METHOD OF MANUFACTURING A MASK FOR RADIATION LITHOGRAPHY

The invention relates to a method of manufacturing a mask for radiation lithography having a mask support and a substrate, on which an absorber layer is provided which is to be structured according to a desired mask pattern.

It is known from "Solid State Technology" 1972, July, pp. 21 to 25 to expose photolacquer with X-ray beams in photolithographic processes, by which, for example, semiconductor systems having structure dimensions in the micron range are manufactured.

The efficiency of lithography can be recognized by the minimum strip width of the structures that can be attained with it: light lithography $\approx 2$ to 0.8 $\mu$m, electron beam lithography, X-ray beam lithography and ion beam lithography $\approx 0.5$ $\mu$m and smaller.

The use of, for example, X-ray beams for exposing a lacquer to be structured affords the advantage that disturbing diffraction phenomena during the projection of the masking structures onto the lacquer layer are reduced. For exposure with X-ray beams, specific irradiation masks for the structure formation in lacquer are required. This also applies to the exposure with ion beams. Since the use of X-ray beam lithography in the submicron range is common practice, the position accuracy and the lateral dimensions of the absorber patterns must be extremely precise.

With respect to the position accuracy, not only the mechanical properties of the substrate on which the absorber layer is provided, but particularly also the stress in the comparatively thick (0.2 to 1.2 $\mu$m) absorber layer are of importance. These stresses are particularly influential if not comparatively thick monocrystalline wafers, for example silicon wafers, having thicknesses of the order of 0.5 mm, but diaphragms having thicknesses in the range of from 1 to 4 $\mu$m are used as substrates. Stresses in the absorber layer should be $< 10^7$ N/m$^2$ and these intrinsic stresses must not vary either during irradiation with lithography radiation or during a longer storage period of the masks.

Very different experiments have been made to obtain low-stress absorber structures. So-called additive methods are known, in which the negative of the desired mask pattern is produced in a thicker lacquer layer and the window regions are filled up by means of electrodeposition of gold. A gold absorber thus obtained has a high accuracy to size and a low intrinsic stress. However, the high thermal expansion of gold, the low ageing stability and the substantial rate of errors (insufficient gold-plating) in the case of manufacture of very fine mask patterns are disadvantageous.

As an alternative, the production of absorber structures by means of reactively etchable absorber layers is known.

Such a method is known, for example, from German Offenleggunschrifft DE-OS 3119682, in which comparatively low-stress masks for X-ray beam or ion beam lithography are obtained by reactive etching of a molybdenum layer, which was deposited on a diaphragm transparent to the lithography radiation and provided on a boron-doped silicon mask support.

These masks have comparatively little stress, but still exhibit residual stresses, which are not desirable for certain applications.

The invention has for its object to provide a method of manufacturing masks for lithography radiation, by which mask structures can be obtained, whose absorber layer only exhibits a minimum residual stress in a defined region and by which this residual stress can be adjusted in a reproducible manner.

According to the invention, this object is achieved in that an absorber layer of partly oxidized tungsten having an oxygen content in the range of from 21 to 29 at.% is formed in the layer on the substrate.

According to advantageous further embodiments of the method in accordance with the invention, the absorber layer has an oxygen content in the range of from 23 to 28 at.% and preferably in the range of from 26 to 27 at.%. The thickness of the absorber layer can be chosen in dependence upon the lithography radiation used.

According to advantageous further embodiments of the method in accordance with the invention, the absorber layer is deposited by means of cathode sputtering, i.e. in layer thicknesses in the range of from 0.2 to 1.2 $\mu$m.

According to further advantageous embodiments of the method in accordance with the invention, before the absorber layer is provided, an intermediate layer transparent to the lithography radiation is first provided on the substrate, which intermediate layer may be an SiO$_2$ layer, an Si$_3$N$_4$ layer, a TiO$_2$ layer and/or a Ti layer, whose thickness lies in the range of from 10 to 100 nm.

Such intermediate layers have the advantage that they act as a diffusion barrier and hence can optimize the layer growth of the absorber layer.

According to advantageous further embodiments of the method in accordance with the invention, either wafers having a thickness of a few tenths of a millimeter of monocrystalline silicon or of silicon carbide or thin diaphragms having a thickness in the range of from 1 to 4 $\mu$m of silicon, silicon carbide, boron nitride or silicon nitride are used as substrates for the absorber layer.

The oxygen content in the absorber layer is a measure for obtaining an extremely low-stress absorber layer of tungsten. Oxygen is incorporated into the absorber layer during the manufacture of the absorber layer by means of a cathode sputtering process and according to an advantageous further embodiment of the method in accordance with the invention it can be adjusted to a desired value in a subsequent annealing process at a temperature of about 200° C. preferably in an oxidizing atmosphere. The desired oxygen content in the layer is checked by means of stress measurements on the substrates provided with the absorber layer, and carried out during the annealing process. If a sufficient quantity of oxygen has already been incorporated into the absorber layer during the process of depositing the absorber layer, the annealing process, which is then carried out in a neutral atmosphere, contributes to the stabilization of the partial oxidation of the deposited absorber material.

If thin diaphragms are used as substrates for the absorber layers, an annealing process may be dispensed with because these thin substrates are already heated up sufficiently during the cathode sputtering process and annealing takes place simultaneously with the deposition of the absorber layer. Thicker substrates, such as, for example, silicon monocrystalline wafers, are heated up to a smaller extent during the process of depositing the absorber layer by means of a cathode sputtering process; in this case, a subsequent process is generally advantageous.

The advantages obtained in accordance with the invention more particularly consist in that extremely lowstress absorber layers can be manufactured.

The residual stresses in the absorber layers adjusted according to the present method are $<10^7 \text{ N/m}^2$ Layers that were manufactured with an oxygen content of about $26.5 \pm 0.5$ at.% in the layer had - even after a storage for a period of many months and after synchrotron irradiationstable stress values $<10^7 \text{ N/m}^2$ A further advantage of the present method is that & also substrates which can be glued onto glass supports, for example in the form of a thin diaphragm, can be provided with an absorber layer; such composite substrates can often be thermally loaded only to a limited extent (up to a temperature $\leq 200°$ C.).

An advantage of the absorber layers manufactured by the present method is that they adhere very satisfactorily to silicon or silicon carbide substrates.

A further advantage of the absorber layers manufactured by the present method is its excellent reactive etchability in fluorine-containing gases for obtaining desired absorber structures and their excellent absorption of X-rays.

A further advantage of the absorber materials in the form of partly oxidized tungsten obtained by the present method is that it can be used suitably in the manufacture of semi-conductor elements having a MOS characteristic (MOS =Metal-On-Silicon). No contamination problems, as is the case, for example, with absorber structures of gold, arise.

Embodiments of the invention will be described with reference to the accompanying drawing. In the drawing.

By way of example, the manufacture of a partly oxidized tungsten absorber layer by means of cathode sputtering will be described.

Figure 1:
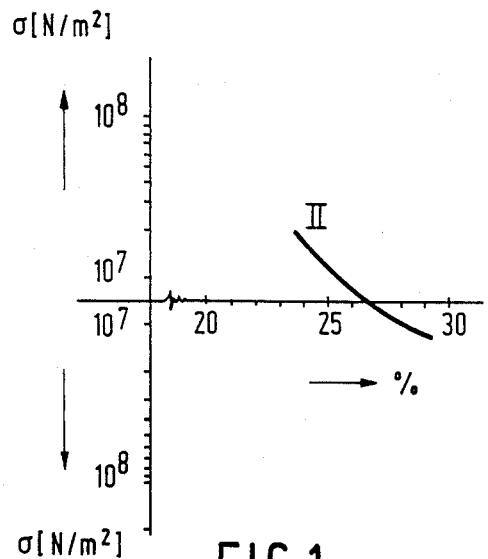
FIG. 1 shows the influence of the oxygen content in tungsten layers manufactured by the method according to the invention on their stress.
Figure 2:
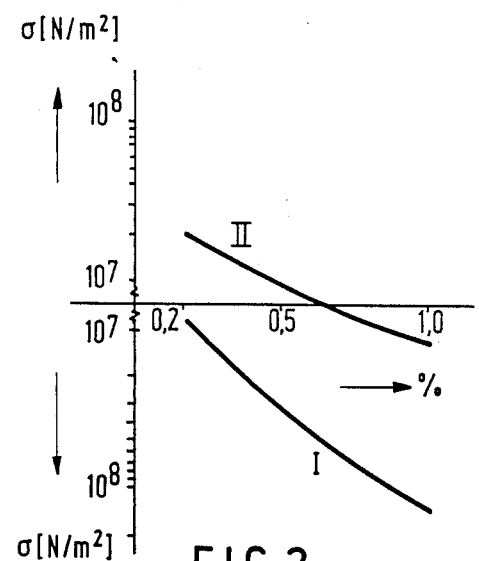
FIG. 2 shows the influence of an annealing process in an oxidizing atmosphere on the stress in oxidized tungsten layers manufactured by the method according to the invention.

In a high-frequency cathode sputtering equipment, a tungsten target, and on a water-cooled substrate holder a substrate in the form of a monocrystalline silicon wafer are arranged at a relative distance of 40 mm. Subsequently, the cathode sputtering equipment is evacuated to a residual gas pressure of $<6.65 \times 10^{-4}$ Pa The cathode sputtering process is carried out in an inert gas atmosphere, for example argon, at a pressure of $\approx 4$ Pa, to which a quantity of oxygen of $\approx 0.6$ % is added, at a power density of 0.8 W/cm². Layers having a thickness of 0.8 $\mu$m are deposited . A layer thus manufactured has a compressive stress of $>5 \times 10^7$Pa. By a subsequent annealing process at a temperature of $\approx 200°$ C. for a period of $\approx 5$ hours, in an oxygen-containing atmosphere, the oxygen quantity in the layer is adjusted to a value of about 26.5 %, as a result of which the stress in the absorber layer is reduced to a value $<10^7 \text{ N/m}^2$. In this connection reference is made to FIGS. 1 and 2, curve I indicating the stress in an unannealed layer and curves II indicating the stress in layers annealed at 200° C. in an oxygen-containing atmosphere. The annealing process may be effected either in the high-frequency cathode sputtering equipment used to deposit the absorber layer or externally.

The oxygen required to reduce the stress in the absorber layer may also be incorporated into the absorber layer in a different manner known to those skilled in the art.

Thus, as described above, the process may be carried out with the use of a $W_xO_x$ target in an argon atmosphere.

The process may also be carried out with the use of a $W_xO_y$ target or of a W target, but with a larger quantity of oxygen than 0.6 % in the gas atmosphere; the parameter of the annealing process succeeding the deposition process are then to be adjusted each time in accordance with the stress values in the absorber layer measured during the annealing process.

The procedure may also be such that the cathode sputtering process for depositing the absorber layer is carried out at a higher power density than 0.8 W/cm², the quantities of the process gas of, for example, argon and oxygen being adjusted in accordance with the desired incorporation of oxygen into the layer. If in this kind of process control use is made, for example, of thin substrates, i.e. diaphragms, a subsequent annealing process can be &economized because thin substrates are automatically heated up sufficiently in a cathode sputtering process at a higher power density.

Figure 3:
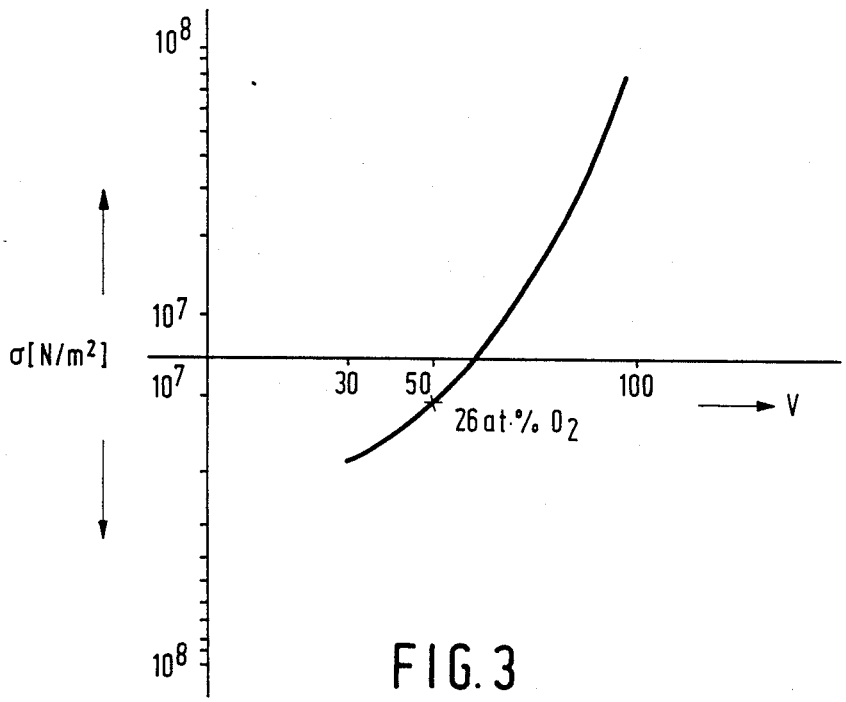
FIG. 3 shows the influence of an electrical bias voltage applied to the substrate during the process of depositing the absorber layer by means of cathode sputtering on the incorporation of oxygen into the layer.

The procedure may also be such that the cathode sputtering process is carried out with a direct voltage or 0 high-frequency alternating voltage applied to the substrate for directed control of the oxygen incorporation into the layer. Suitable process parameters in this case are 60 V direct voltage or higher-frequency alternating voltage, process gas argon containing 0.1 % of oxygen, process gas pressure $\approx 4$ Pa. After an annealing process at a temperature of $\approx 200°$ C. for a period of $\approx 15$ hours in an oxygen-containing atmosphere, there is a quantity of oxygen of 26 at.% in the layer (compare FIG.3).

The desired incorporation of oxygen into the absorber layer may also be effected, for example, by implantation of oxygen ions.

Intermediate layers have proved to be advantageous as diffusion barriers between the substrate and the absorber layer. Within the scope of the present method, different layers having a thickness of about 10 nm were provided by means of high-frequency cathode sputtering at a power density of 0.8 W/cm² in the following manner:

1. SiO₂ layer by means of an SiO₂ target in an argon atmosphere at a pressure of $\approx 2.7$ Pa;
2. Si₃N₄ layer by means of an Si target in an argon/nitrogen atmosphere (argon pressure $\approx 0.8$ Pa, nitrogen pressure $\approx 0.5$ Pa);
3. TiO₂ layerby means of a Ti target in an argon/oxygen atmosphere (argon pressure $\approx 0.8$ Pa, oxygen pressure $\approx 1.6$ Pa);
4. Ti layer by means of a Ti target in an argon atmosphere at a pressure of $\approx 0.8$ Pa.

It is advantageous to provide for compensation of residual stresses in the absorber layer on the absorber layer having a thickness of, for example, 0,8 $\mu$m a covering layer, for example a nitride layer, transparent to the lithography radiation and having a thickness of 0.2 $\mu$m by means of cathode sputtering. To this end, as process gas use is made of nitrogen and argon (argon pressure ≈0.8 Pa, nitrogen pressure ≈0.5 Pa) and this layer is deposited at a power density of 0.8 W/cm$^2$.

What is claimed is:

1. A method of manufacturing a mask for radiation lithography comprising the steps of
   (a) forming a mask support and substrate,
   (b) forming an absorber layer of partly oxidized tungsten having an oxygen content of from 21 to 29 at.% on said substrate, wherein said absorber layer only exhibits a reproducible adjustable minimum residual stress in a defined region of said absorber layer,
   (c) structuring said absorber layer into a predetermined mask pattern, and
   (d) subjecting said absorber layer to a step of annealing at least during said step (b) to control oxygen content in said absorber layer, and to obtain a low stress absorber layer.

2. A method according to claim 1, wherein said absorber layer is formed with an oxygen content in the range from 23 to 28 at.%.

3. A method according to claim 1, wherein said absorber layer is formed with an oxygen content in the range from 26 to 27 at.%.

4. A method according to claim 1 or claim 2 or claim 3, wherein said absorber layer is formed to a thickness in the range from 0.2 to 1.2µm.

5. A method according to claim 4, wherein said absorber layer is formed by cathode sputtering.

6. A method according to claim 5, wherein before said step (b), an intermediate layer is formed on said substrate, said absorber layer being formed on said intermediate layer, and said intermediate layer being transparent to lithography radiation.

7. A method according to claim 6, wherein said intermediate layer is formed of at least one of SiO$_2$, Si$_3$N$_4$, TiO$_2$, or Ti.

8. A method according to claim 7, wherein said substrate is formed of one of a monocrystalline silicon wafer having a thickness in the range of a few tenths of millimeter or of a silicon diaphragm having a thickness in the range of 1 to 4µm.

9. A method according to claim 8, wherein annealing of said absorber layer is carried out at a temperature in the range of about 100 to 400° C. for a period of 1 to 15 hours.

10. A method according to claim 9, wherein said annealing is carried out in an oxidizing atmosphere.

11. A method according to claim 10, wherein a covering layer is formed on said absorber layer to a thickness in the range of 0.05 to 0.7 µm for compensating residual stresses.

12. A method according to claim 11, wherein said covering layer is formed of a nitride layer.

13. A method according to claim 11, wherein an electrical bias voltage in the range of 30 to 100V is applied to said substrate during said step (b), said electrical bias voltage being one of direct voltage or high-frequency alternating voltage.

14. A method according to claim 8, wherein an electrical bias voltage in the range of 30 to 100V is applied to said substrate during said step (b), said electrical bias voltage being one of direct voltage or high-frequency alternating voltage.

15. A method according to claim 7, wherein said substrate is formed of one of a silicon carbide wafer having a thickness in the range of a few tenths of a millimeter or a silicon carbide diaphragm having a thickness in the range of 1 to 4µm.

16. A method according to claim 15, wherein annealing of said absorber layer is carried out at a temperature in the range of about 100 to 400° C. for a period of 1 to 15 hours.

17. A method according to claim 16, wherein said annealing is carried out in an oxidizing atmosphere.

18. A method according to claim 17, wherein a covering layer is formed on said absorber layer to a thickness in the range of 0.05 to 0.7 µm for compensating residual stresses.

19. A method according to claim 18, wherein said covering layer is formed of a nitride layer.

20. A method according to claim 18, wherein an electrical bias voltage in the range of 30 to 100V is applied to said substrate during said step (b), said electrical bias voltage being one of direct voltage or high-frequency alternating voltage.

21. A method according to claim 15, wherein an electrical bias voltage in the range of 30 to 100V is applied to said substrate during said step (b), said electrical bias voltage being one of direct voltage or high-frequency alternating voltage.

22. A method according to claim 7, wherein said substrate is formed of a boron nitride diaphragm having at thickness in the range of 1 to 4µm.

23. A method according to claim 22, wherein annealing of said absorber layer is carried out at a temperature in the range of about 100 to 400° C. for a period of 1 to 15 hours.

24. A method according to claim 23, wherein said annealing is carried out in an oxidizing atmosphere.

25. A method according to claim 24, wherein a covering layer is formed on said absorber layer to a thickness in the range of 0.05 to 0.7µm for compensating residual stresses.

26. A method according to claim 25, wherein said covering layer is formed of a nitride layer.

27. A method according to claim 25, wherein an electrical bias voltage in the range of 30 to 100V is applied to said substrate during said step (b), said electrical bias voltage being one of direct voltage or high-frequency alternating voltage.

28. A method according to claim 22, wherein an electrical bias voltage in the range of 30 to 100V is applied to said substrate during said step (b), said electrical bias voltage being one of direct voltage or high-frequency alternating voltage.

29. A method according to claim 7, wherein said substrate is formed of a silicon nitride diaphragm having a thickness in the range of 1 to 4µm.

30. A method according to claim 29, wherein annealing of said absorber layer is carried out at a temperature in the range of about 100 to 400° C. for a period of 1 to 15 hours.

31. A method according to claim 30, wherein said annealing is carried out in an oxidizing atmosphere.

32. A method according to claim 31, wherein a covering layer is formed on said absorber layer to a thickness in the range of 0.05 to 0.7 µm for compensating residual stresses.

33. A method according to claim 32, wherein said covering layer is formed of a nitride layer.

34. A method according to claim 32, wherein an electrical bias voltage in the range of 30 to 100V is applied to said substrate during said step (b), said electrical bias voltage being one of direct voltage or high-frequency alternating voltage.

35. A method according to claim 29, wherein an electrical bias voltage in the range of 30 to 100V is applied to said substrate during said step (b), said electrical bias voltage being one of direct voltage or high-frequency alternating voltage.

36. A method according to claim 1, wherein said absorber layer is formed by cathode sputtering.

37. A method according to claim 1, wherein before said step (b), an intermediate layer is formed on said substrate, said absorber layer being formed on said intermediate layer, and said intermediate layer being transparent to lithography radiation.

38. A method according to claim 37, wherein said intermediate layer is formed of at least one of $SiO_2$, $Si_3N_4$, $TiO_2$, or Ti.

39. A method according to claim 1, wherein said substrate is formed of one of a monocrystalline silicon wafer having a thickness in the range of a few tenths of a millimeter or of a silicon diaphragm having a thickness in the range of 1 to 4μm.

40. A method according to claim 1, wherein said substrate is formed of one of a silicon carbide wafer having a thickness in the range of a few tenths of a millimeter or a silicon carbide diaphragm having a thickness in the range of 1 to 4μm.

41. A method according to claim 1, wherein said substrate is formed of a boron nitride diaphragm having a thickness in the range of 1 to 4μm.

42. A method according to claim 1, wherein said substrate is formed of a silicon nitride diaphragm having a thickness in the range of 1 to 4μm.

43. A method according to claim 1, wherein annealing of said absorber layer is carried out at a temperature in the range of about 100 to 400° C. for a period of 1 to 15 hours.

44. A method according to claim 43, wherein said annealing is carried out in an oxidizing atmosphere.

45. A method according to claim 1, wherein a covering layer is formed on said absorber layer to a thickness in the range of 0.05 to 0.7μm for compensating residual stresses.

46. A method according to claim 45, wherein said covering layer is formed of a nitride layer.

47. A method according to claim 1 wherein an electrical bias voltage in the range of 30 to 100V is applied to said substrate during said step (b), said electrical bias voltage being one of direct voltage or high-frequency alternating voltage.

* * * * *